United States Patent [19]
Cole, Jr. et al.

[11] Patent Number: 5,338,975
[45] Date of Patent: Aug. 16, 1994

[54] HIGH DENSITY INTERCONNECT STRUCTURE INCLUDING A SPACER STRUCTURE AND A GAP

[75] Inventors: Herbert S. Cole, Jr., Burnt Hills; James W. Rose, Guilderland, both of N.Y.

[73] Assignee: General Electric Company, Schenectady, N.Y.

[21] Appl. No.: 546,965

[22] Filed: Jul. 2, 1990

[51] Int. Cl.⁵ .................... H01L 23/48; H01L 29/46; H01L 29/54
[52] U.S. Cl. .................... 257/750; 257/758; 257/760; 257/700; 361/764; 361/783
[58] Field of Search .................... 357/75, 71; 247/750, 247/698, 775, 759, 700, 751, 754, 757, 763, 741, 713, 714, 719, 738, 766; 361/414, 783, 764, 758, 762, 773

[56] References Cited
U.S. PATENT DOCUMENTS

| | | | |
|---|---|---|---|
| 4,750,089 | 6/1988 | Derryberry et al. | 361/388 |
| 4,866,508 | 9/1989 | Eichelberger et al. | 357/74 |
| 4,873,615 | 10/1989 | Grabbe | 361/395 |
| 4,890,194 | 12/1989 | Derryberry et al. | 361/386 |
| 4,894,706 | 1/1990 | Sato et al. | 357/72 |
| 4,916,523 | 4/1990 | Sokolovsky et al. | 357/74 |
| 4,989,067 | 1/1991 | Noble et al. | 357/69 |
| 4,991,000 | 2/1991 | Bone et al. | 357/75 |
| 4,991,927 | 2/1991 | Anstey | 350/96.20 |
| 4,999,311 | 3/1991 | Dzarnoski, Jr. et al. | 437/51 |
| 5,016,138 | 5/1991 | Woodman | 361/381 |
| 5,017,434 | 5/1991 | Enloe et al. | 428/428 |
| 5,025,306 | 6/1991 | Johnson et al. | 357/75 |

Primary Examiner—John B. Sotomayor
Attorney, Agent, or Firm—Geoffrey H. Krauss

[57] ABSTRACT

A high frequency electronic component which is interconnected with other components through a high density interconnect structure sees only an air dielectric constant in the high density interconnect structure because a spacer structure disposed on the electronic component spaces the dielectric of the high density interconnect structure from the surface of the electronic component by a sufficient distance that the higher dielectric constant of the polymer dielectric layers of the high density interconnect structure only minimally affects the operating characteristics of the electronic components.

29 Claims, 10 Drawing Sheets

HIGH DENSITY INTERCONNECT STRUCTURE INCLUDING A SPACER STRUCTURE AND A GAP

RELATED APPLICATIONS

This application is related to application Ser. No. 07/504,770, entitled "A High Density Interconnect Structure Including a Chamber" by R. J. Wojnarowski et al., filed Apr. 5, 1990; application Ser. No. 07/596,963 entitled "Multiple Lamination High Density Interconnect Process and Structure Employing Thermoplastic Adhesives having Sequentially Decreasing Tg's" by H. S. Cole et al., filed Jul. 2, 1990; and application Ser. No. 07/546,964, entitled "High Temperature Polyether Imide Compositions and Method of Making" by J. H. Lupinski et al., filed Jul. 2, 1990, each of which is incorporated herein by reference in its entirety.

BACKGROUND OF THE INVENTION

1. Field of the Invention

The present invention relates to the field of high density interconnected circuits, and more particularly, to high frequency high density interconnected circuits.

2. Background Information

Microwave systems are often composed of monolithic microwave integrated circuits (MMICs), other active microwave devices such as gallium arsenide (GaAs) transistors, passive microwave components and other non-microwave components such as logic and control structures.

A monolithic microwave integrated circuit or MMIC is an integrated circuit which is designed to operate at microwave frequencies. MMICs are normally fabricated in GaAs because of the much higher potential operating frequency which GaAs provides as compared to silicon. A typical MMIC may include one or more amplifiers, some passive components and one or more feedback loops which provide feedback from the output of an amplifier or circuit back to its input to establish a desired transfer function for that circuit.

It is known in the art to fabricate microwave systems from a variety of such components by providing a ceramic substrate having microstrip RF circuitry, DC supply lines (conductors), logic lines, control lines and contact pads fabricated thereon and by attaching devices and components such as MMICs, GaAs transistors, other microwave and supporting components to the substrate and connecting them to the circuitry on the substrate using wire bonds or tab interconnections.

Such fabrication techniques have a number of disadvantages which are discussed more fully in the related application Ser. No. 07/504,770, entitled "A High Density Interconnect Structure Including a Chamber".

A high density interconnect (HDI) structure or system which has been developed by General Electric Company offers many advantages in the compact assembly of digital and other electronic systems. For example, an electronic system such as a microcomputer which incorporates between 30 and 50 chips can be fully assembled and interconnected on a single substrate which is 2 inches long by 2 inches wide by 0.050 inch thick. The maximum operating frequency of such systems is normally, at present, less than about 50 MHz. Even more important than the compactness of this high density interconnect structure is the fact that it can be disassembled for repair or replacement of a faulty component and then reassembled without significant risk to the good components incorporated within the system. This reworkability or repairability is a substantial advance over prior connection systems in which reworking the system to replace damaged components was either impossible or involved substantial risk to the good components.

Briefly, in this high density interconnect structure, a ceramic substrate such as alumina which may be 100 mils thick and of appropriate size and strength for the overall system, is provided. This size is typically less than 2 inches square, but may be made larger or smaller. Once the position of the various chips has been specified, individual cavities or one large cavity having appropriate depth at the intended locations of differing chips, is prepared. This may be done by starting with a bare substrate having a uniform thickness and the desired size. Conventional, ultrasonic or laser milling may be used to form the cavities in which the various chips and other components will be positioned. For many systems where it is desired to place chips nearly edge-to-edge, a single large cavity is satisfactory. That large cavity may typically have a uniform depth where the semiconductor chips have a substantially uniform thickness. Where a particularly thick or a particularly thin component will be placed, the cavity bottom may be made respectively deeper or shallower to place the upper surface of the corresponding component in substantially the same plane as the upper surface of the rest of the components and the portion of the substrate which surrounds the cavity. The bottom of the cavity is then provided with a thermoplastic adhesive layer which may preferably be polyetherimide resin available under the trade name ULTEM ® 6000 from the General Electric Company. The various components are then placed in their desired locations within the cavity, the entire structure is heated to about 300° C. which is above the softening point of the ULTEM ® polyetherimide (which is in the vicinity of 235° C.) and then cooled to thermoplastically bond the individual components to the substrate. Thereafter, a polyimide film which may be Kapton ® polyimide, available from E.I. du Pont de Nemours Company, which is $\approx 0.0005$–$0.003$ inch ($\approx 12.5$–$75$ microns) thick is pretreated to promote adhesion by reactive ion etching (RIE), the substrate and chips are then coated with ULTEM ® 1000 polyetherimide resin or another thermoplastic and the Kapton film is laminated across the top of the chips, any other components and the substrate with the ULTEM ® resin serving as a thermoplastic adhesive to hold the Kapton ® in place. Thereafter, via holes are provided (preferably by laser drilling) in the Kapton ® and ULTEM ® layers in alignment with the contact pads on the electronic components to which it is desired to make contact. A metallization layer which is deposited over the Kapton ® layer extends into the via holes and makes electrical contact to the contact pads disposed thereunder. This metallization layer may be patterned to form individual conductors during the process of depositing it or may be deposited as a continuous layer and then patterned using photoresist and etching. The photoresist is preferably exposed using a laser to provide an accurately aligned conductor pattern at the end of the process. Alternatively, exposure through a mask may be used.

Additional dielectric and metallization layers are provided as required in order to provide all of the desired electrical connections among the chips. Any misposition of the individual electronic components and their contact pads is compensated for by an adaptive laser lithography system which is the subject of some of the U.S. Patents and Patent Applications which are listed hereinafter.

This high density interconnect structure, methods of fabricating it and tools for fabricating it are disclosed in U.S. Pat. No. 4,783,695, entitled "Multichip Integrated Circuit Packaging Configuration and Method" by C. W. Eichelberger, et al.; U.S. Pat. No. 4,835,704, entitled "Adaptive Lithography System to Provide High Density Interconnect" by C. W. Eichelberger, et al.; U.S. Pat. No. 4,714,516, entitled "Method to Produce Via Holes in Polymer Dielectrics for Multiple Electronic Circuit Chip Packaging" by C. W. Eichelberger, et al.; U.S. Pat. No. 4,780,177, entitled "Excimer Laser Patterning of a Novel Resist" by R. J. Wojnarowski et al.; U.S. patent application Ser. No. 249,927, filed Sep. 27, 1989, entitled "Method and Apparatus for Removing Components Bonded to a Substrate" by R. J. Wojnarowski, et al.; U.S. patent application Ser. No. 310,149, filed Feb. 14, 1989, entitled "Laser Beam Scanning Method for Forming Via Holes in Polymer Materials" by C. W. Eichelberger, et al.; U.S. patent application Ser. No. 312,798, filed Feb. 21, 1989, entitled "High Density Interconnect Thermoplastic Die Attach Material and Solvent Die Attachment Processing" by R. J. Wojnarowski, et al.; U.S. patent application Ser. No. 283,095, filed Dec. 12, 1988, entitled "Simplified Method for Repair of High Density Interconnect Circuits" by C. W. Eichelberger, et al.; U.S. patent application Ser. No. 305,314, filed Feb. 3, 1989, entitled "Fabrication Process and Integrated Circuit Test Structure" by H. S. Cole, et al.; U.S. patent application Ser. No. 250,010, filed Sep. 27, 1988, entitled "High Density Interconnect With High Volumetric Efficiency" by C. W. Eichelberger, et al.; U.S. patent application Ser. No. 329,478, filed Mar. 28, 1989, entitled "Die Attachment Method for Use in High Density Interconnected Assemblies" by R. J. Wojnarowski, et al.; U.S. patent application Ser. No. 253,020, filed Oct. 4, 1988, entitled "Laser Interconnect Process" by H. S. Cole, et al.; U.S. patent application Ser. No. 230,654, filed Aug. 5, 1988, entitled "Method and Configuration for Testing Electronic Circuits and Integrated Circuit Chips Using a Removable Overlay Layer" by C. W. Eichelberger, et al.; U.S. patent application Ser. No. 233,965, filed Aug. 8, 1988, entitled "Direct Deposition of Metal Patterns for Use in Integrated Circuit Devices" by Y. S. Liu, et al.; U.S. patent application Ser. No. 237,638, filed Aug. 23, 1988, entitled "Method for Photopatterning Metallization Via UV Laser Ablation of the Activator" by Y. S. Liu, et al.; U.S. patent application Ser. No. 237,685, filed Aug. 25, 1988, entitled "Direct Writing of Refractory Metal Lines for Use in Integrated Circuit Devices" by Y. S. Liu, et al.; U.S. patent application Ser. No. 240,367, filed Aug. 30, 1988, entitled "Method and Apparatus for Packaging Integrated Circuit Chips Employing a Polymer Film Overlay Layer" by C. W. Eichelberger, et al.; U.S. patent application Ser. No. 342,153, filed Apr. 24, 1989, entitled "Method of Processing Siloxane-Polyimides for Electronic Packaging Applications" by H. S. Cole, et al.; U.S. patent application Ser. No. 289,944, filed Dec. 27, 1988, entitled "Selective Electrolytic Deposition on Conductive and Non-Conductive Substrates" by Y. S. Liu, et al.; U.S. patent application Ser. No. 312,536, filed Feb. 17, 1989, entitled "Method of Bonding a Thermoset Film to a Thermoplastic Material to Form a Bondable Laminate" by R. J. Wojnarowski; U.S. patent application Ser. No. 363,646, filed Jun. 8, 1989, entitled "Integrated Circuit Packaging Configuration for Rapid Customized Design and Unique Test Capability" by C. W. Eichelberger, et al.; U.S. patent application Ser. No. 07/459,844, filed Jan. 2, 1990, entitled "Area-Selective Metallization Process" by H. S. Cole, et al.; U.S. patent application Ser. No. 07/457,023, filed Dec. 26, 1989, entitled "Locally Orientation Specific Routing System" by T. R. Haller, et al.; U.S. patent application Ser. No. 456,421, filed Dec. 26, 1989, entitled "Laser Ablatable Polymer Dielectrics and Methods" by H. S. Cole, et al.; U.S. patent application Ser. No. 454,546, filed Dec. 21, 1989, entitled "Hermetic High Density Interconnected Electronic System" by W. P. Kornrumpf, et al.; U.S. patent application Ser. No. 07/457,127, filed Dec. 26, 1989, entitled "Enhanced Fluorescence Polymers and Interconnect Structures Using Them" by H. S. Cole, et al.; U.S. patent application Ser. No. 454,545, filed Dec. 21, 1989, entitled "An Epoxy/Polyimide Copolymer Blend Dielectric and Layered Circuits Incorporating It" by C. W. Eichelberger, et al.; application Ser. No. 07/504,760, filed Apr. 5, 1990, entitled, "A Building Block Approach to Microwave Modules", by W. P. Kornrumpf et al.; application Ser. No. 07/504,821, filed Apr. 5, 1990, entitled, "HDI Microwave Circuit Assembly", by W. P. Kornrumpf, et al.; application Ser. No. 07/504,750 filed Apr. 5, 1990, entitled, "An Ultrasonic Array With a High Density of Electrical Connections", by L. S. Smith, et al.; application Ser. No. 07/504,803, filed Apr. 5, 1990, entitled, "Microwave Component Test Method and Apparatus", by W. P. Kornrumpf, et al.; application Ser. No. 07/504,753, filed Apr. 5, 1990, entitled, "A Compact High Density Interconnected Microwave System", by W. P. Kornrumpf; application Ser. No. 07/504,769, filed Apr. 5, 1990, entitled, "A Flexible High Density Interconnect Structure and Flexibly Interconnected System" by C. W. Eichelberger, et al.; application Ser. No. 07/504,751, filed Apr. 5, 1990, entitled, "Compact, Thermally Efficient Focal Plane Array and Testing and Repair Thereof", by W. P. Kornrumpf, et al.; application Ser. No. 07/504,749, filed Apr. 5, 1990, entitled, "High Density Interconnect Structure with Top Mounted Components", by R. J. Wojnarowski, et al.; application Ser. No. 07/504,770, filed Apr. 5, 1990, entitled, "A High Density Interconnect Structure Including a Chamber", by R. J. Wojnarowski, et al.; and application Ser. No. 07/504,748, filed Apr. 5, 1990, entitled, "Microwave Component Having Tailored Operating Characteristics and Method of Tailoring" by W. P. Kornrumpf, et al. Each of these Patents and Patent Applications is incorporated herein by reference.

This high density interconnect system has been developed for use in interconnecting semiconductor chips to form digital systems. That is, for the connection of systems whose operating frequencies are typically less than about 50 MHz, which is low enough that transmission line, other wave impedance matching and dielectric loading effects have not needed to be considered.

The interconnection of microwave structures or devices intended to operate at GHz frequencies presents many problems, considerations and challenges not faced in the interconnection of digital systems which operate at frequencies of less than 50 MHz. Use of microwave frequencies requires consideration of wave characteristics, transmission line effects, material properties at microwave frequencies, the presence of exposed delicate structures on MMICs and other components and system and component characteristics which do not exist at the lower operating frequencies of such digital systems. These considerations include the question of whether the dielectric materials are suitable for use at microwave frequencies, since materials which are good dielectrics at lower frequencies can be quite lossy or even conductive at microwave frequencies. Further, even if the dielectric is not lossy at microwave frequencies, its dielectric constant itself may be high enough to unacceptably modify the operating characteristics of MMICs, GaAs transistors and other microwave components or structures which might be interconnected using a high density interconnect structure.

The above-listed application Ser. No. 07/504,821, entitled, "HDI Microwave Circuit Assembly" overcomes the problem of high dielectric constant of the high density interconnect structure dielectric material by removing the high density interconnect dielectric from portions of the chip which are overlay sensitive. By overlay sensitive, we mean that the operating characteristics of the device or component are different when the device or component is free of high density interconnect structure dielectric material than they are when the high density interconnect structure dielectric is disposed on the chip or structure or at least on overlay-sensitive portions of the chip or structure.

Unfortunately, the techniques disclosed in application Ser. No. 07/504,821 suffer from the disadvantage that the need to exclude the high density interconnect structure dielectric layer from the surface of overlay-sensitive microwave components severely restricts the surface area available for the routing of high density interconnect structure conductors since they cannot be routed over the area from which the dielectric layer is to be removed. Where chips are closely packed for maximum density, this essentially limits the high density interconnect structure to the routing of conductors in the streets and avenues portion of the structure which extends from the contact pads of one chip to the contact pads of the adjacent chip. For systems in which relatively low interconnection density is required, this limitation can be accommodated without serious impact on the system structure or operation. However, where a high density of interconnect conductors is required, such a restriction can make a system unroutable or require excessive numbers of layers of interconnect conductors or can require that the chips to be spaced further apart than would otherwise be necessary, just for the purpose of widening the streets and avenues to accommodate the required quantity of interconnect conductors.

Digital systems which are designed with very small features and/or which are designed to operate at frequencies in the GHz range can be sensitive to the presence of a dielectric layer thereover, even when they are not in the classic sense, microwave circuits in that they do not employ transmission lines and analog techniques. In such very high frequency digital systems, there is a need for a high density of interconnections which is similar to that need in such systems which operate in the 50 MHz and less frequency range. Removing the dielectric layer over the center of the chips severely restricts the available routing area.

Related application Ser. No. 07/504,770, entitled, "A High Density Interconnect Structure Including a Chamber" places overlay-sensitive chips in deep enough cavities that their upper surfaces are spaced below the upper substrate surface, laminates the initial high density interconnect dielectric layer to the chips and substrate in a manner which causes that dielectric layer to "sag" down onto the recessed surfaces of these chips. Metallization disposed on that first dielectric layer contacts each of the recessed contact pads and extends up the slope of the "sag" onto the planar portion of that initial dielectric layer. That initial dielectric layer is then removed from the overlay-sensitive portions of the chips. A second, taut dielectric layer is then laminated across the entire structure. This second dielectric layer is spaced from the overlay-sensitive portion of the recessed chips by the depth to which the tops of those chips are recessed. A normal high density interconnect structure metallization layer is then formed on this second dielectric layer with contact to the recessed contact pads being made via the portions of the initial metallization which are disposed over the top of the substrate.

While this accommodates the need, it is more cumbersome to fabricate than normal high density interconnect structures and is not directly applicable to flexible high density interconnect structures which are to be separated from their fabrication carrier (substrate) after fabrication as taught in related, incorporated by reference applications Ser. No. 250,010, entitled "High Density Interconnect With High Volumetric Efficiency" and Ser. No. 07/504,770, entitled, "A High Density Interconnect Structure Including a Chamber".

Accordingly, there is a need for a high density interconnect structure which accommodates the overlay sensitivity of many components without sacrificing the routing density of the high density interconnect structure, which is applicable to substrateless high density interconnect structures and whose fabrication is more similar to the standard fabrication process.

OBJECTS OF THE INVENTION

Accordingly, a primary object of the present invention is to provide a high density interconnect structure having an air dielectric disposed above overlay sensitive portions of integrated circuits and other components.

Another object of the present invention is to provide a simplified overall structure for such a system.

Another object of the present invention is to provide a simplified process for fabricating a high density interconnect structure with an air dielectric disposed between overlay sensitive portions of electronic components and overlying dielectric material.

Another object of the present invention is to provide a process for providing an air gap in a high density interconnect structure which involves only a single lamination step.

SUMMARY OF THE INVENTION

The above and other objects which will become apparent from the specification as a whole, including the drawings, are accomplished in accordance with the present invention by providing a spacer structure on integrated circuits and other components which are overlay sensitive. The initial dielectric layer of the high density interconnect structure is laminated to this spacer structure, with that dielectric layer being spaced from the surface of the electronic components by substantially the thickness of the spacer structure. Preferably this spacer structure is laterally displaced from overlay sensitive portions of the electronic component(s). Contact pads which are connected to conductors of the high density interconnect structure are referred to as connected contact pads. Each of the connected contact pads preferably has the spacer structure disposed thereon in order that interconnection vias may be formed in an overlying dielectric layer in alignment with the contact pads, with the vias extending into electrical contact with the contact pads and having solid, uninterrupted walls suitable for subsequent deposition of the metal of the high density interconnect structure in those vias to connect the contact pads to the conductive runs in the high density interconnect structure itself. Where the spacer structure is non-conductive, these via holes preferably extend through the entire thickness of the spacer structure in alignment with connected contacted pads in order to electrically connect them to the high density interconnect structure. Where the spacer structure is conductive with each contact pad having an electrically separate post disposed thereon, the via holes extend through only the first dielectric layer to expose part of the upper surface of the conductive posts.

In accordance with one preferred embodiment, dielectric material is disposed on the electronic components and patterned to leave their overlay sensitive portions uncovered. The remaining dielectric material then comprises the spacer structure. This spacer structure dielectric material is preferably sprayed or spun-on, but may be laminated if desired A first high density interconnect structure dielectric layer is then laminated to the spacer structure with a thermoplastic adhesive. That first dielectric layer is held sufficiently taut during the lamination process that after completion of the lamination process it remains spaced from the overlay sensitive portions of the electronic components by substantially the height of the spacer structure.

The spacer structure may comprise a plurality of spaced apart posts or a continuous ridge such as an annular polymer dielectric wall extending along the periphery of a chip. Such a wall or ridge may include separate posts or projecting portions which extend out over contact pads which would not otherwise be covered by the dielectric wall.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
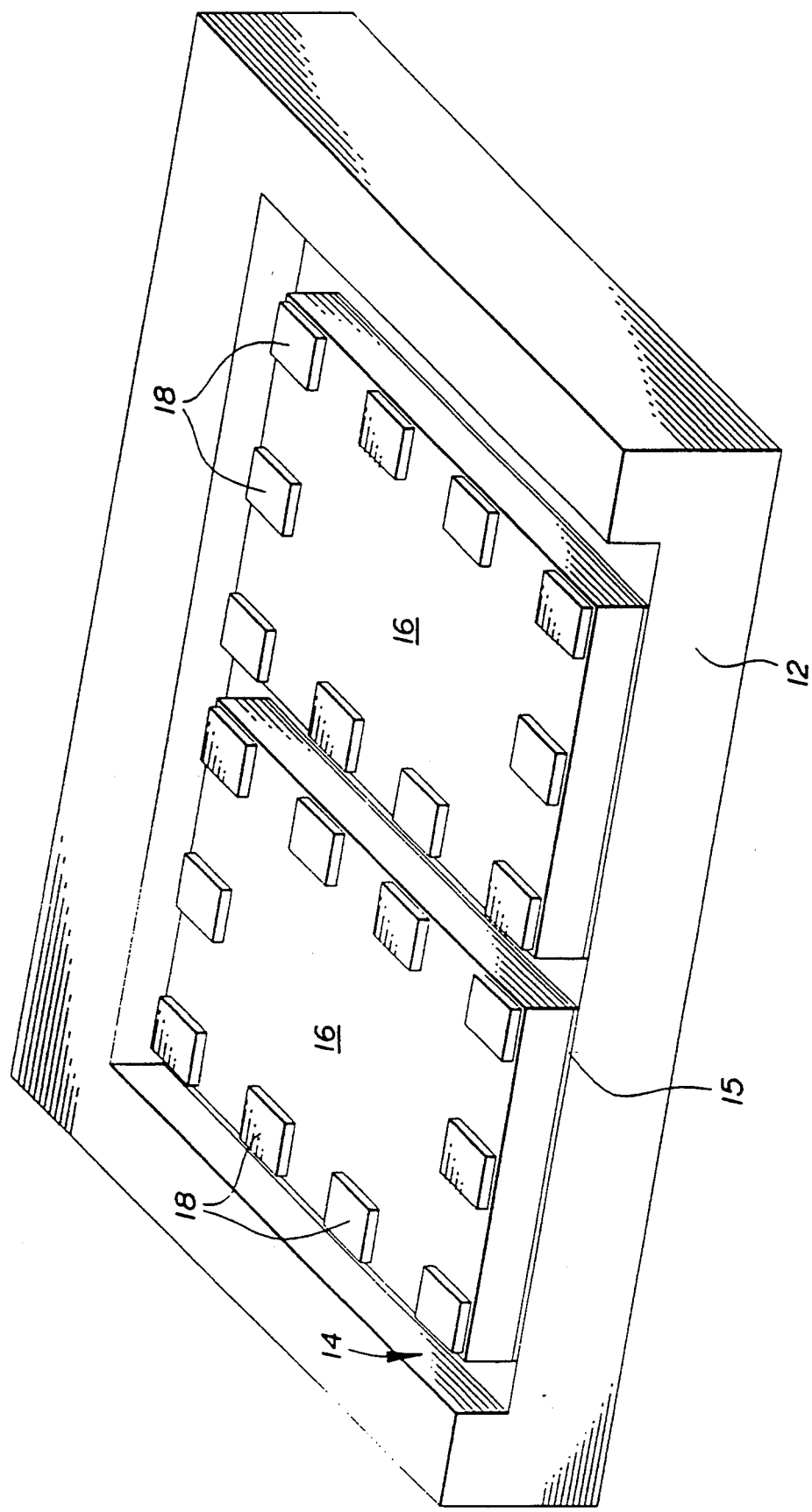
FIG. 1 is a perspective illustration of two integrated circuit chips bonded to a high density interconnect structure substrate ready for the fabrication of the overlying high density interconnect structure.

FIG. 1 is a perspective partially cut away view of a high density interconnect structure substrate 12 having a cavity 14 in which a plurality of integrated circuit chips 16 are disposed. Two of these chips are illustrated in the figure. Chips 16 have contact pads 18 disposed on their upper surface. In this structure, the integrated circuit chips 16 have been bonded to the bottom of the cavity 14 by a thermoplastic adhesive 15 which may preferably be a polyetherimide such as ULTEM ® 6000 polyetherimide resin available from General Electric Company and the structure is ready for fabrication of a high density interconnect structure thereon.

Figure 2:
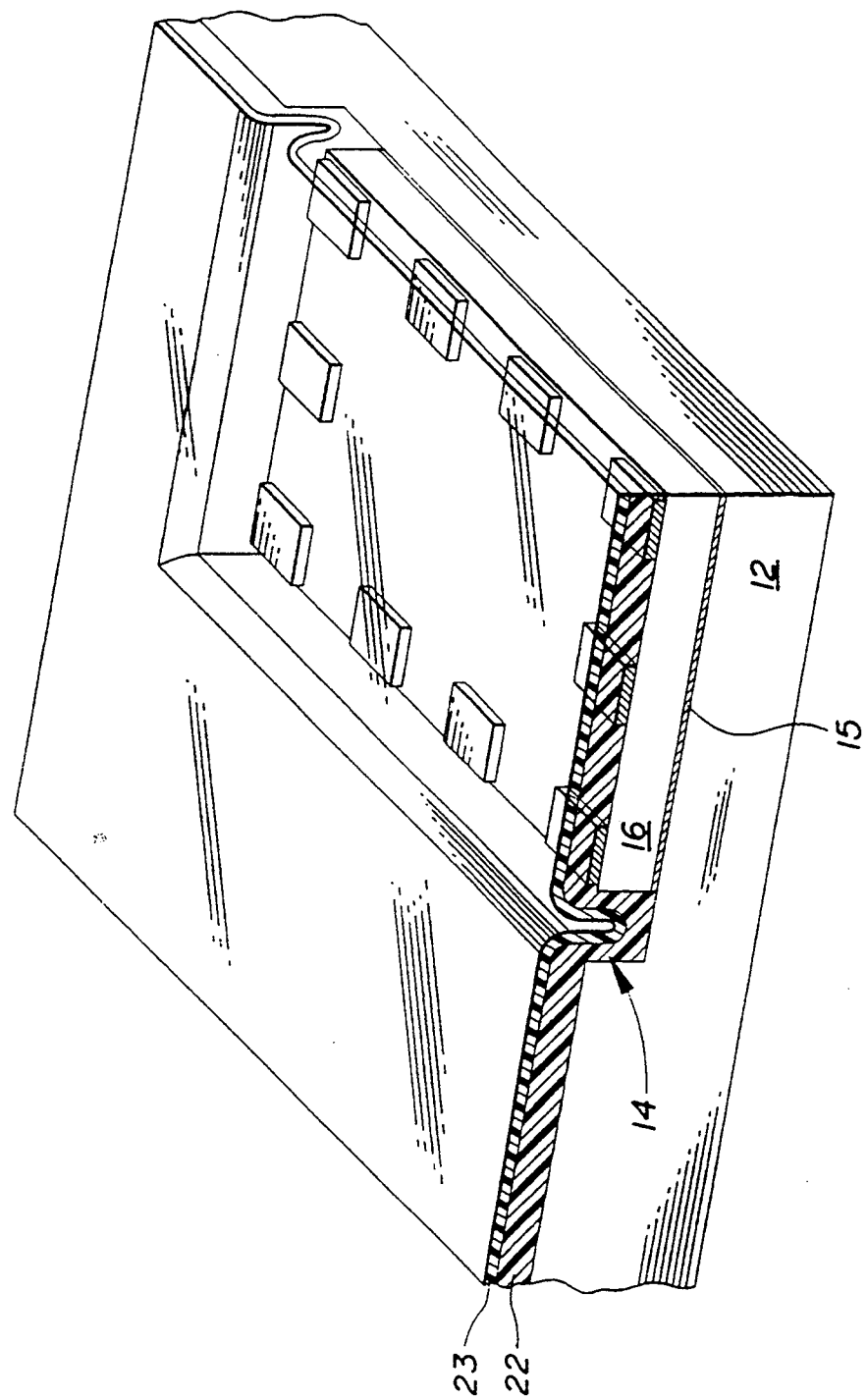
FIGS. 2-6 illustrate sequential stages in the fabrication of a high density interconnect structure on the substrate and chips of FIG. 1.

The fabrication of this high density interconnect structure begins with the fabrication of a spacer structure. In accordance with one embodiment of the invention, a first step in the process of forming the spacer structure comprises depositing a uniform layer of polyamic acid on top of both the integrated circuit chips 16 and the exposed surface of the substrate 12. This structure is then baked at 100° C. for one half hour to remove the solvent in the polyamic acid polymer to leave a layer 22 of dry polyamic acid. Next, a layer 23 of photoresist is deposited on top of the dried polyamic acid layer 22. The structure at the end of this step is illustrated in FIG. 2.

Next, the photoresist 23 is exposed using a masked light source or a laser to leave a structure in which the photoresist is insoluble in its developer only on those portions of the dried polyamic acid which are coincident with the desired location of the spacer structure. The photoresist is then developed in the normal fashion with a dilute basic developer. This development removes the soluble portions of the photoresist and the polyamic acid thereunder. Thereafter, the remaining photoresist is removed in a normal fashion with an organic solvent, leaving the structure illustrated in FIG. 3 in which the polyamic acid 22 is present on the entire upper surface of the substrate 12 and in localized places on the integrated circuit chips 16. Preferably, a post portion 22P of the dry polyamic acid is disposed over each of the contact pads 18 of the chips 16 to which electrical contact is to be made during the fabrication of the high density interconnect structure. Posts 22P may also be provide elsewhere on the chip or on the substrate. At this stage, the structure is preferably baked at 250° C. to imidize the polyamic acid layer and thereby obtain the high thermal stability characteristic of polyimides. After baking, the polymerized polyamic acid is identified by the reference numeral 24 because of its changed chemical structure. Next, a thermally stable polymer dielectric film 27, such as KAPTON ® polyimide available from E.I. DuPont de Nemours, is laminated over the structure illustrated in FIG. 3. This may preferably be done using ULTEM ® 1000 polyetherimide resin available from General Electric Company as a thermoplastic adhesive 25 for the polyimide film 27. The thermoplastic adhesive 25 for the polyimide film 27 together comprise a high density interconnect dielectric layer 26. This lamination is done with the KAPTON polyimide held taut and using a lamination temperature which does not adversely affect either the polyimide spacer structure or the integrated circuit chips themselves. After completion of this lamination step, the laminated dielectric layer 26 is spaced from the integrated circuit surface by substantially the thickness of the spacer structure, as shown in FIG. 4.

Figure 5:
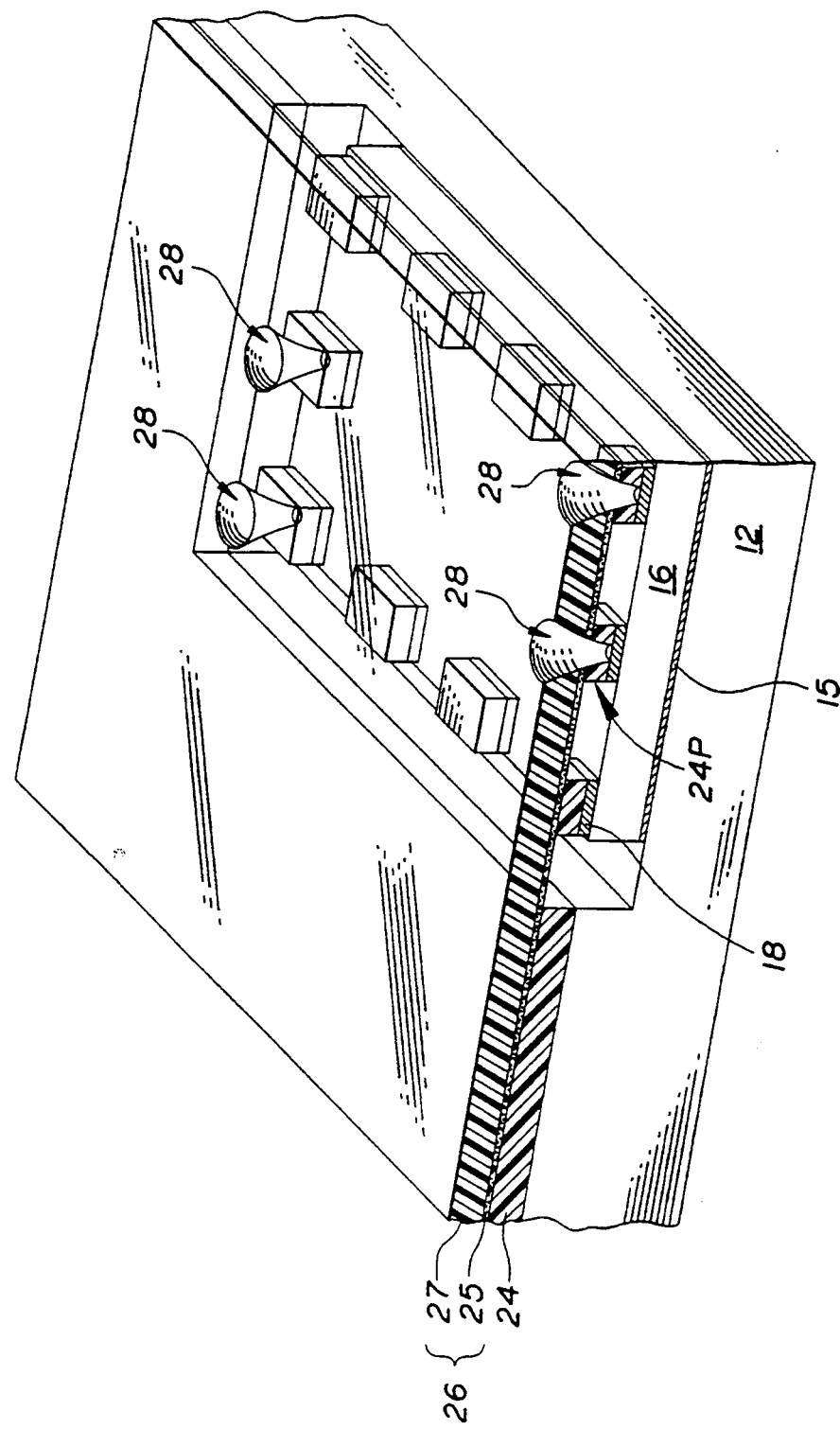

Next, via holes 28 are formed in dielectric layer 26 in alignment with those contact pads 18 to which electrical contact is desired as shown in FIG. 5. These via holes are preferably formed by laser drilling. However, other methods such as reactive ion etching (RIE) may be used.

Figure 6:
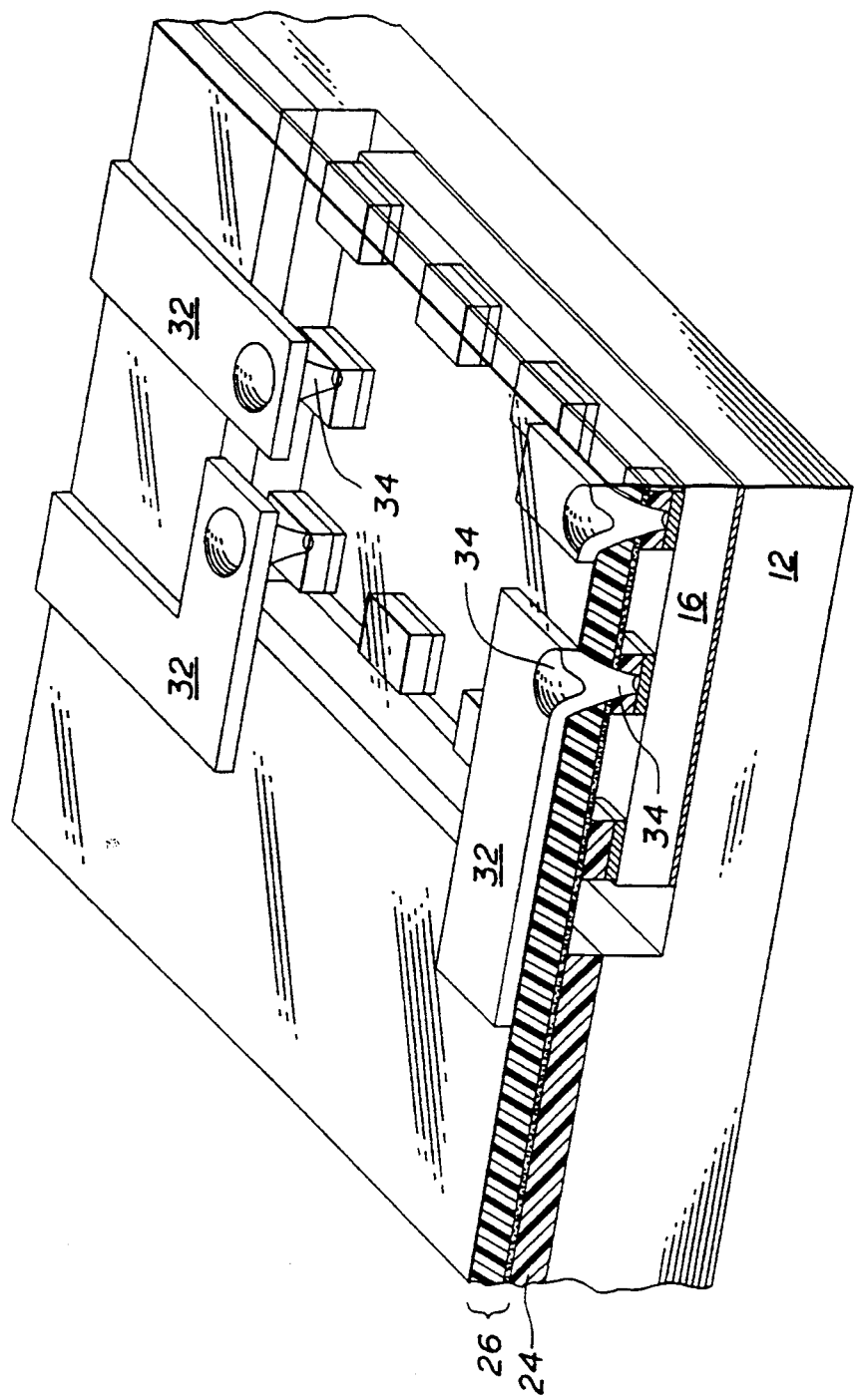

A first patterned layer of metallization is then formed on the initial dielectric layer 26. This metallization may preferably be formed by sputtering an initial or barrier layer of titanium onto the structure illustrated in FIG. 5 followed by sputtering a (thin) copper layer, which may then be electroplated to a desired thickness, after which a second titanium layer is formed on top of the copper. This Ti/Cu/Ti metallization layer is then patterned to leave only the conductors 32 desired in this first metallization layer of the high density interconnect structure as shown in FIG. 6. The conductors 32 include via portions 34 which extend down into the via holes 28 into ohmic contact with the contact pads 18 at the bottoms of the via holes.

Where desired, additional layers of dielectric and conductors may be formed on the structure illustrated in FIG. 6 until all of the required connections are provided.

The height of the spacer structure should be chosen in accordance with the sensitivity of the electronic components. A spacer structure height of greater than or equal to about 12 microns is preferred for microwave applications, since a spacer structure which is less than about 6 microns thick provides little benefit in minimizing the effect of the high density interconnect structure on the operating characteristics of the high frequency electronic components and a spacer structure thicker than about 25 microns provides very little additional isolation of the electronic components from the effect of the overlying high density interconnect structure dielectric materials.

The process which has been described has a potential disadvantage of the adhesive for the first laminated dielectric layer partially filling the gap provided by the spacer structure if the adhesive is put on too thick or flows more than anticipated. The potential for this problem to occur can be avoided by the following process variation. The spacer structure material or its precursor is provided as a continuous layer on the substrate and the chips. Where the spacer material is a thermoset material, that material is then thermoset prior to patterning it. The adhesive for the first laminated dielectric layer is then sprayed or spun-on on top of that unpatterned spacer layer. This combined layer is then patterned as a unit to leave it only where the spacer structure is desired. This may be done in several ways. A masking layer may be deposited on the combined spacer/adhesive layer and patterned with photoresist or other techniques to leave it only on the spacer structure. Thereafter, the structure is etched to remove the exposed portions of the spacer/adhesive layer. With a silicon nitride mask this may be done with reactive ion etching. With a reflective metal mask this may be done using an excimer laser to ablate the spacer/adhesive layer. The masking layer may then be removed. Alternatively, it can be done using a scanned focused laser beam to ablate the unneeded portions. At the end of this process, after appropriate clean-up if needed, the first laminated dielectric layer is laminated on top of the spacer structure using the retained adhesive as it bonding agent. This is preferably done without any adhesive being disposed on the laminated film prior to its lamination. However, adhesive may also be provided on the laminated film, although that partially defeats the purpose of providing the adhesive on the spacer structure.

By processing in the manner just described, the layer of spacer structure material (polyimide) is present everywhere on the top of the substrate as a uniform layer, unless the polyamic acid is patterned in that area to provide air gaps over conductor runs on the substrate surface. Where no such patterned spacer structure is desired on the main surface of the substrate, the spacer structure polyimide may be omitted there by providing a chip-holding cavity 14 which is deeper by the height of the posts and removing the polyamic acid from the entire upper surface of the substrate to leave it only on the chips in a patterned manner. This would result in the laminated film 27 being planar and directly laminated to the upper surface of the substrate.

Figure 3:
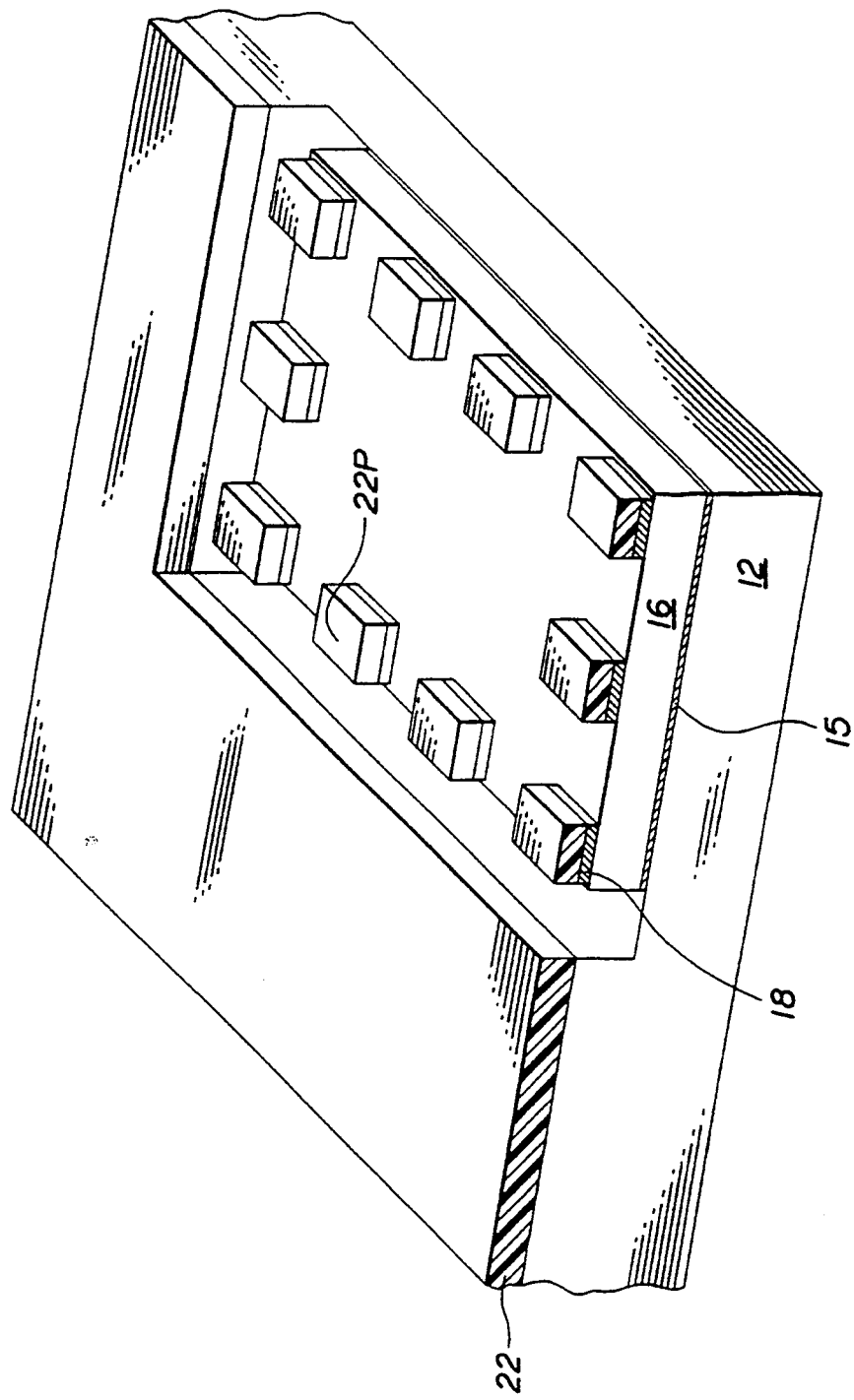
Figure 4:
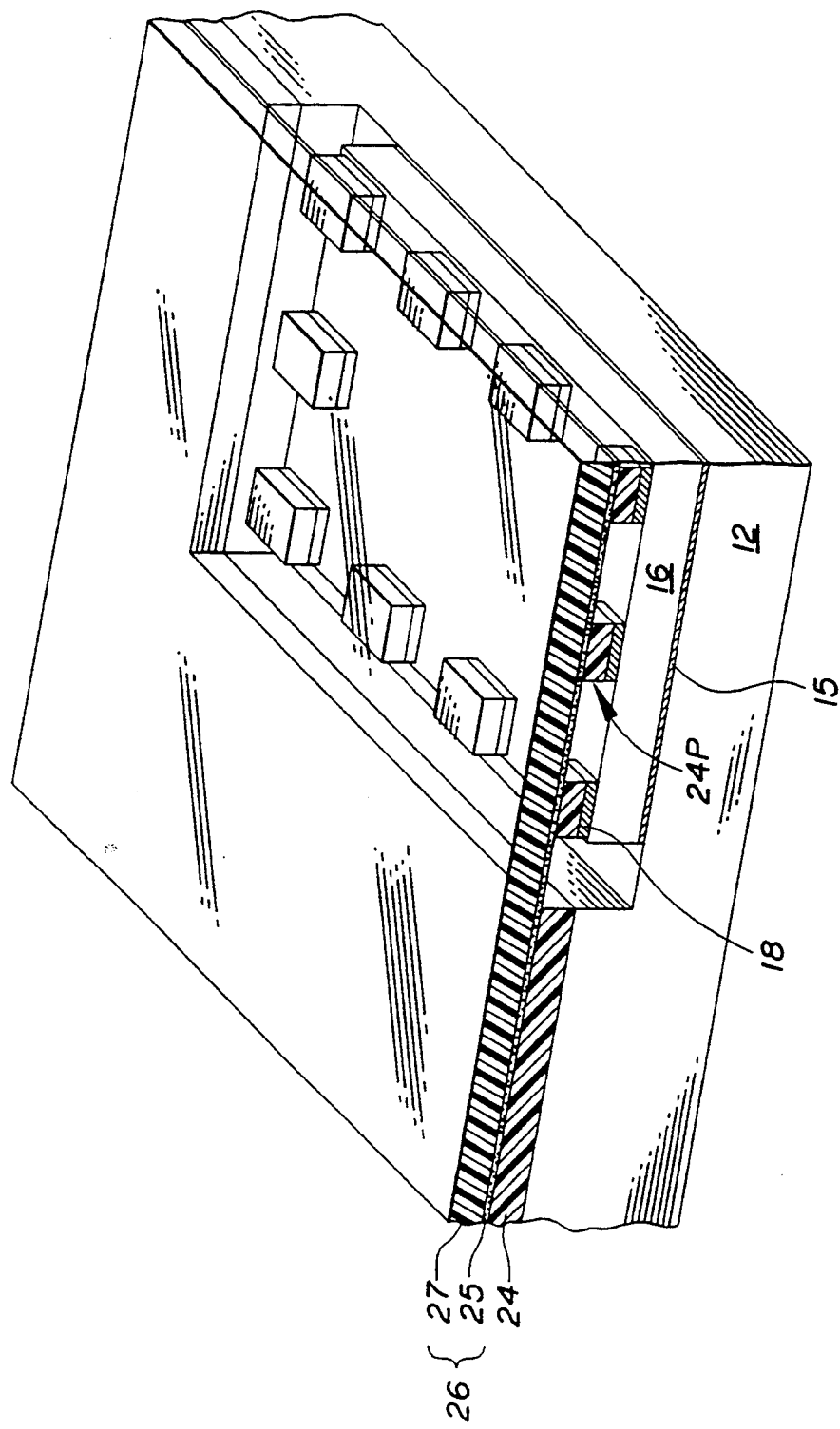
Figure 7:
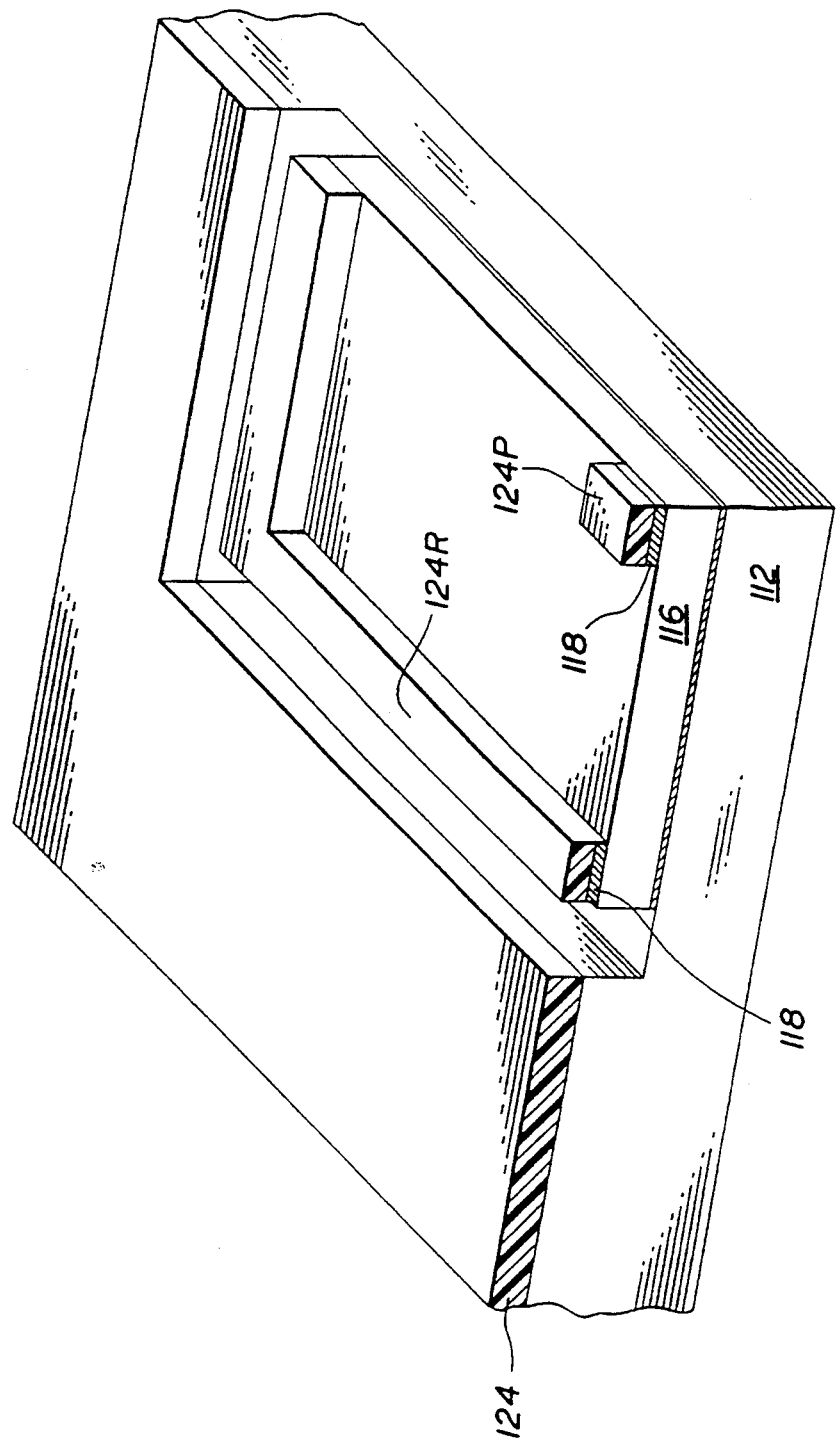
FIGS. 7 and 8 illustrate alternative configurations for the spacer structure illustrated in FIG. 3.
Figure 8:
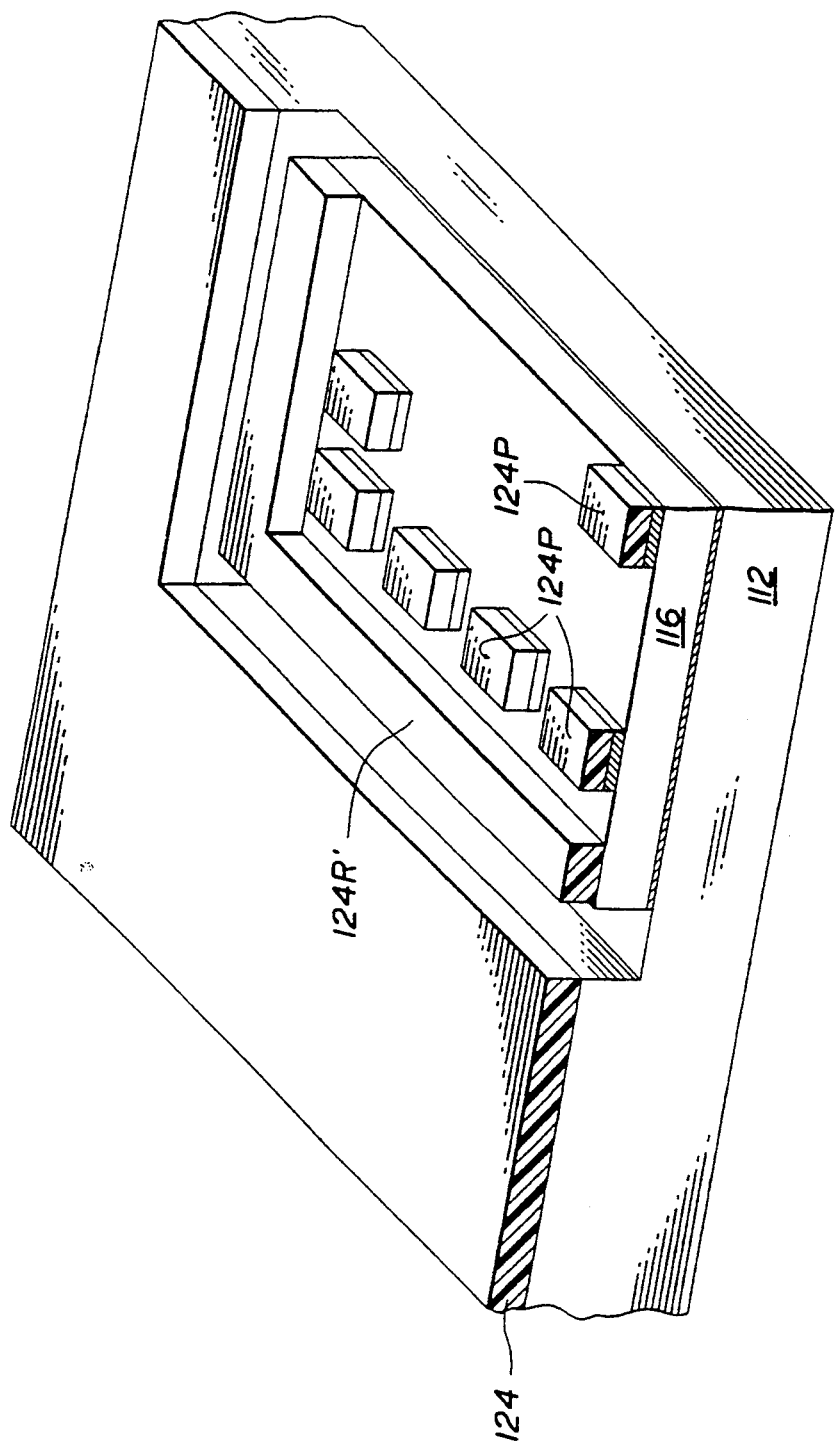

As an alternative to the individual posts 24P illustrated in FIG. 3, the spacer structure may have the ridge configuration illustrated in FIG. 7. In FIG. 7, rather than the integrated circuit chip 116 having isolated posts disposed on top of its contact pads 118 in the manner shown in FIG. 3, a continuous ridge 124R of polymer dielectric material is provided on the upper surface of the chip 116 along the periphery of the chip. This ridge 124R may overlie the contact pads 118 of the integrated circuit chip as shown in FIG. 7 or a ridge 124R' may be disposed outside the contact pads 118 as shown in FIG. 8, with individual posts 124P disposed over the individual contact pads 118. The FIG. 8 configuration is preferred since the higher dielectric constant between the contact pads in FIG. 7 as compared to FIG. 8 increases capacitive coupling and loading thereby affecting the operating characteristics of the system. As illustrated, additional isolated posts 124P may also be provided in either of these embodiments to help suspend the laminated dielectric layer across large, otherwise unsupported, expanses or to provide a portion of the spacer structure over isolated contact pads or for other reasons. In a modified version of the FIG. 8 configuration, individual projections may be provided on the ridge 124R to extend over individual contact pads rather than providing individual isolated posts. In flexible high density interconnection structures from which the substrate is removed after fabrication is complete as taught in application Ser. No. 250,010, entitled "High Density Interconnect With High Volumetric Efficiency" and application Ser. No. 07/504,769, entitled, "A Flexible High Density Interconnect Structure and Flexibly Interconnected System", listed above, this ridge spacer structure of FIGS. 7 and 8 is advantageous because in combination with the laminated initial dielectric layer, it seals the edges of the chip's upper surface.

Figure 9:
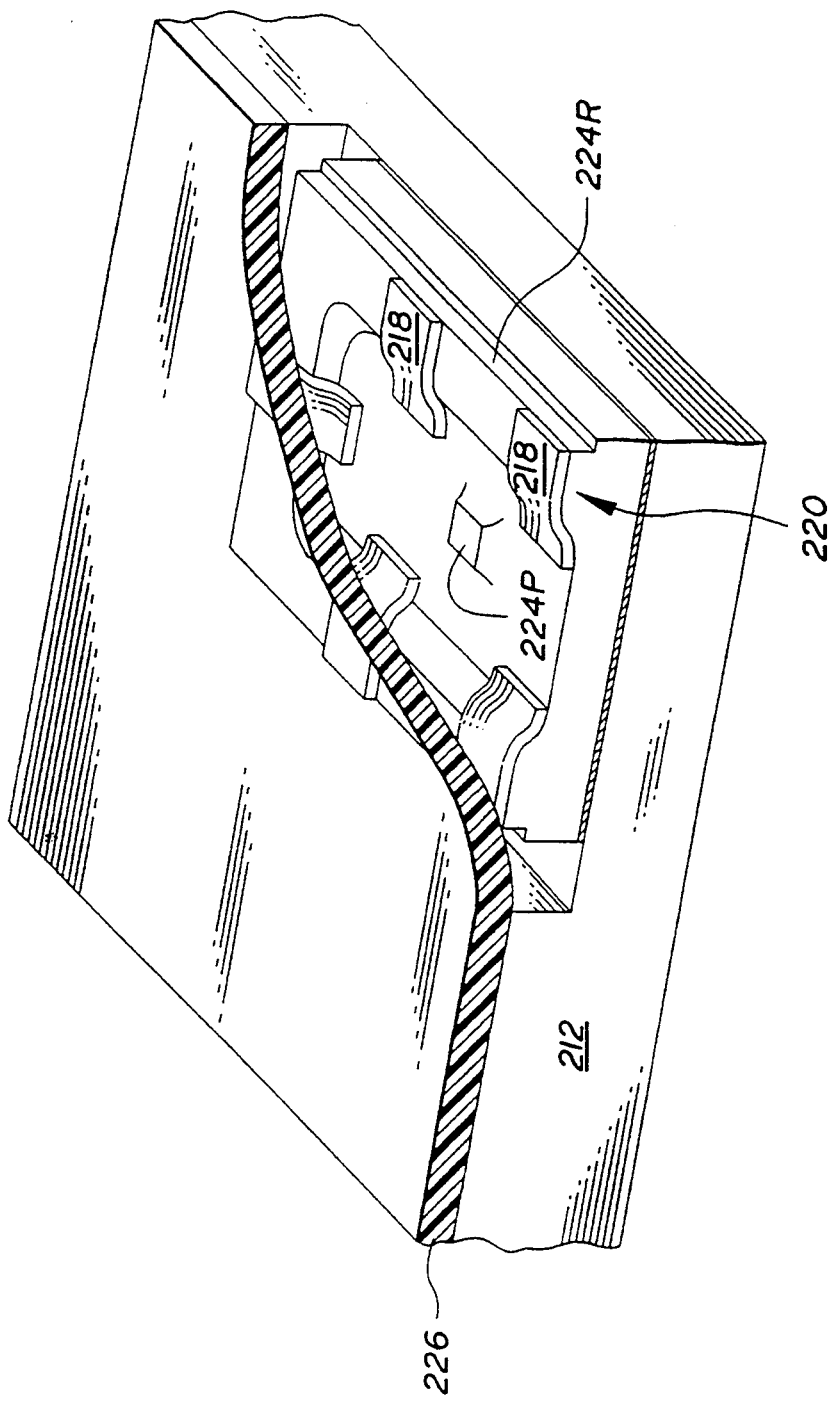
FIG. 9 illustrates a further alternative configuration for the spacer structure and the contact pads on the integrated circuit chip.

In FIG. 9, a further alternative embodiment for a dielectric spacer structure 220 is illustrated in which a raised ridge 224R serves as the spacer and the contact pads 218 extend up onto the ridge 224R. In this configuration, the spacer structure itself may be a glass or other suitable dielectric layer which may be provided during the fabrication of the integrated circuit chip prior to deposition of the metal of the contact pads which preferably extend up onto the top of the spacer structure. In this manner, the chip, with its spacer structure 224R thereon, is disposed in a cavity of appropriate depth to place the upper surface of the spacer structure in substantially the same plane as the plateau portion of the upper surface of the substrate 212. The first dielectric layer 226 of the interconnection structure may be laminated directly across the substrate and the chip and will remain spaced from the overlay sensitive portions of the chip surface because of the ridge 224R of the spacer structure. If desired, during the fabrication of the integrated circuit in this embodiment posts 224P may be provided in the inner portion of the chip in addition to the ridge around the periphery. In this structure, connection is made between the first layer of metallization of the high density interconnect structure and the contact pads in a manner which is similar to that used where a high density interconnect structure does not include a spacer structure in that the via hole through the initial dielectric layer to the contact pads extends only through that initial dielectric layer.

Figure 10:
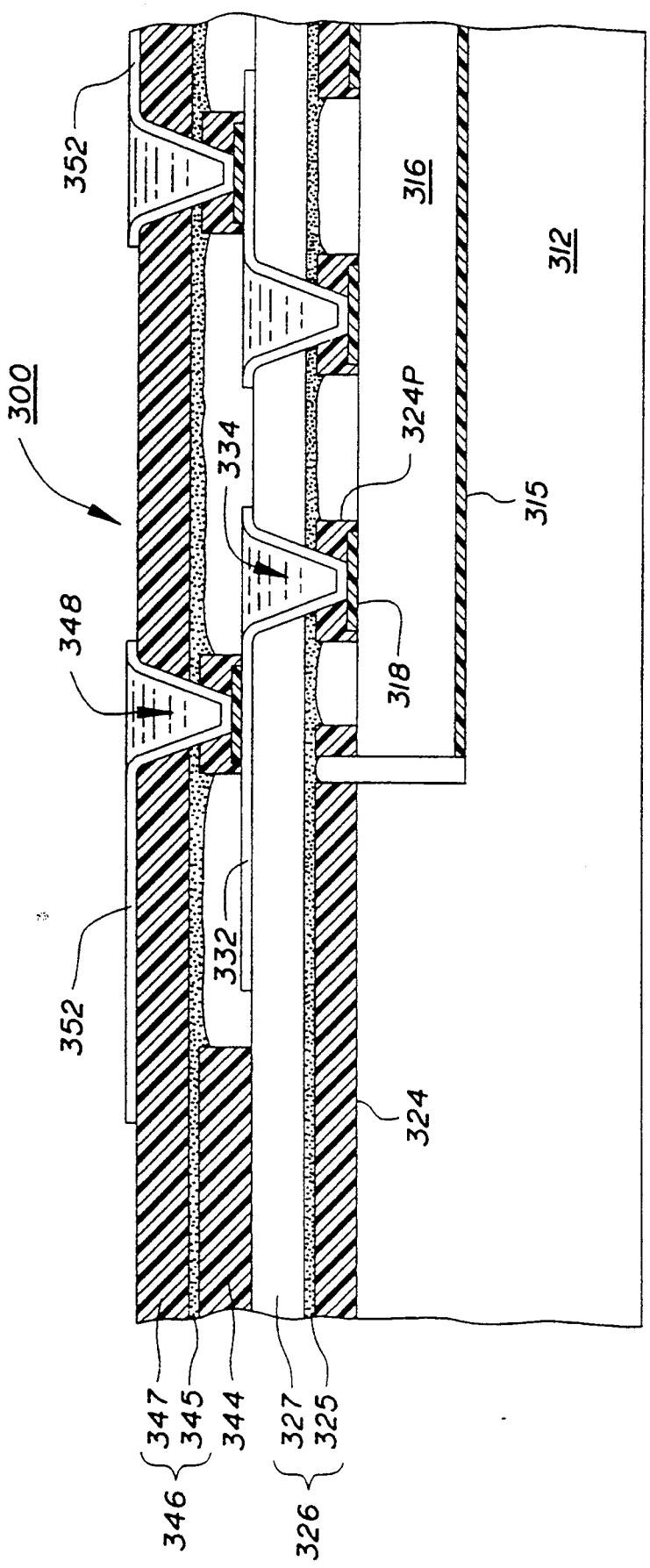
FIG. 10 is a perspective cross-section view of a multilayer high density interconnect structure having air gaps within the high density interconnect structure.

In some structures, it may be found desirable to include spacer structures between the individual metallization layers within the high density interconnect structure itself in order to minimize the dielectric constant seen by conductor runs within the high density interconnect structure itself. Such a structure is illustrated in cross-section in FIG. 10. In that structure, a spacer structure 344 is formed on top of the conductors 332 of the first metallization layer of the high density interconnect structure 300 prior to laminating a second dielectric layer 346 over that second spacer structure. Following that second lamination, via holes 348 are drilled in the second laminated dielectric layer 346 and through the second spacer structure 344 to the first metallization layer 332 in those locations where electrical contact between the first and second metallization layers is desired. The second metal layer is then deposited on the second dielectric layer and patterned in a manner such as has been described in the related patents and applications to provide conductors 352.

Where an air gap structure is desired within the high density interconnect structure itself, as shown in FIG. 10, it is considered desirable to use progressively lower $T_g$ adhesive layers for each successive lamination in order to ensure that previous laminations are not disturbed during subsequent lamination steps. Suitable adhesives and a further description of the appropriate techniques are contained in the related applications Ser. No. 07/546,964 and Ser. No. 07/546,963. One potential advantage of this structure is an ability to provide a partially air dielectric for microwave transmission lines formed within the high density interconnect structure as taught in related application Ser. No. 07/504,821, entitled, "HDI Microwave Circuit Assembly". An air dielectric can be provided by employing a metallized KAPTON film in combination with provision of the lamination adhesive only on the already existing high density interconnect structure and laminating that metallized KAPTON with its metallized side toward that high density interconnect structure. Pre-patterning of the metallization on the KAPTON being desirable where contact needs to be made from above the metallized KAPTON to below that metallized KAPTON layer.

In the procedure described in connection with FIGS. 2-6, the initial via holes are drilled through both the first laminated dielectric layer 26 and the spacer structure posts 24. An alternative, but not preferred approach is to form via holes in the spacer structure prior to the lamination of the first dielectric layer 26 thereover. These via holes would be disposed over each contact pad to which electrical contact is to be made. The structure would then have a patterned metallization formed thereon in which the metal pattern extends into each of the via holes in ohmic contact with the underlying contact pad and provides an appropriate surface on top of the spacer structure for contact by subsequent metallization layers. This patterned metal layer would preferably be formed by selective deposition in order to minimize risks to the portions of the electronic components or chips which are not covered by the spacer structure 24. The first dielectric layer 26 would then be laminated over this metallized spacer structure and via holes would be drilled in that dielectric layer in alignment with the spacer structure metallization in a manner similar to that described above in connection with FIGS. 5 and 6.

As an alternative to the use of polyamic acid as a precursor of the spacer structure, a thermoplastic may be employed as the spacer structure. This has several advantages. First, the thermoplastic spacer structure may be removed during repair of a high density interconnect structure in a manner similar to that in which the high density interconnect structure itself is removed for repair as described in the background patents and applications. Second, if the thermoplastic is itself laminated to the substrate 12 and the chip 16 at a temperature in the vicinity of its own $T_g$, then the high temperature exposure of the chips during the solvent bake-out and the imidization of the polyamic acid process may be avoided.

As an alternative approach to forming the spacer structure, a silicon nitride mask may preferably be evaporated on top of either thermoplastic or thermoset polymeric spacer layers and patterned using photoresist and a silicon nitride etchant such as RIE (reactive ion etching) with $CF_4$. Thereafter, the underlying polymeric dielectric layer may be patterned by reactive ion etching in a $O_2$ atmosphere. Reactive ion etching in this atmosphere has substantially no effect on the silicon nitride layer with the result that a spacer structure of substantially any useful height may be patterned in this manner. The photoresist may be removed from the retained portions of the silicon nitride layer prior to reactive ion etching or may be left in place during that etching, in which case, the reactive ion etching also removes that photoresist material at the same time as it removes the unprotected underlying portions of the polymeric material of the spacer structure. Following completion of the patterning of the spacer structure, the silicon nitride mask is preferably removed from the top of the spacer structure using a $CF_4$ RIE etch. RIE is a relatively slow process for removing organic materials of this type. Consequently, it may be considered preferable to provide a metal mask rather than a silicon nitride mask and to use an excimer laser to ablate any unprotected portions of the spacer structure material to provide the desired spacer configuration. After completion of this patterning step, the metal mask is removed and the process proceeds as has been described.

As a further alternative, where the spacer structure comprises individual posts disposed over individual contact pads, the spacer structure may be formed of conductive material such as a metal. This may be done by masking the structure to restrict metal deposition to the contact pads and then electroplating additional metal on the contact pads in the manner taught in related applications Ser. No. 289,944, "Selective Electrolytic Deposition on Conductive and Non-Conductive Substrates" and Ser. No. 07/459,944, "Area-Selective Metallization Process". In this manner, a spacer structure comprised of individual metallic posts may be formed with a desired thickness. It will be noted that this spacer structure can be formed on the integrated circuit chips prior to attachment of those chips to the substrate. With this spacer structure in place, the first dielectric layer 26 is laminated to the substrate and the posts of the spacer structure. Via holes are then drilled in the first dielectric layer to expose a portion of the upper surface of each of the posts to which electrical contact by the high density interconnect structure is desired. A first metallization layer is then formed on the first dielectric layer and patterned to provide the conductors desired in that layer.

If it is necessary to disassemble this structure to rework or repair it, the posts of the spacer structure can be removed with an appropriate solvent if they are thermoplastic. Thermoplastic and thermoset posts and any adhesive layers can be removed with RIE plasma etching or by excimer or other laser ablation as may be considered preferable.

While the description has been in terms of polyimide and polyetherimide materials, the materials disclosed in application Ser. No. 07/546,964 (20,055) may also be used as may low dielectric constant materials such as Teflon.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

We claim:

1. In a high density interconnect structure of the type comprising an electronic component having contact pads on a first surface thereof, an interconnection structure thereover including a first layer of polymer dielectric material disposed over said electronic component, said layer of polymer dielectric material having apertures therein disposed in alignment with at least selected ones of said contact pads, a first patterned conductive layer overlying said first dielectric layer and extending into said apertures into ohmic contact with said selected ones of said contact pads, the improvement comprising:

a spacer structure disposed on a portion of said first surface of said electronic component, leaving other portions of said first surface free of spacer structure; and said first layer of polymer dielectric material being bonded to said spacer structure and spaced from said first surface of said electronic component by said spacer structure.

2. The improvement recited in claim 1 wherein:
    said spacer structure comprises a polymer dielectric; and
    said surface of said electronic component is substantially free of polymer dielectric material except for said spacer structure.

3. The high density interconnect structure recited in claim 1 wherein:
    said spacer structure comprises an elongated ridge of dielectric material.

4. The high density interconnect structure recited in claim 3 wherein:
    said ridge is continuous, closed on itself and surrounds a portion of said first surface of said electronic component.

5. The high density interconnect structure recited in claim 4 wherein:
    said electronic component comprises a semiconductor chip and at least some of said contact pads are disposed along the periphery of said first surface of said semiconductor chip; and
    said ridge constitutes a wall around the periphery of said chip.

6. The high density interconnect structure recited in claim 5 wherein:
    those contact pads which are disposed in electrical contact with a conductor of said interconnection structure are referred to as a connected contact pads; and
    said connected contact pads have dielectric material of said ridge disposed thereon.

7. The high density interconnect structure recited in claim 1 wherein:
    said spacer structure comprises a plurality of spaced apart posts.

8. The high density interconnect structure recited in claim 7 wherein:
    each contact pad which is disposed in electrical contact with a conductor of said interconnection structure has a post disposed thereon and is referred to as a connected contact pad.

9. The improvement recited in claim 8 wherein:
    said posts comprise a polymer;
    each of said posts disposed on one of said connected contact pads has a via hole therein in which a conductor of said interconnection structure extends into electrical contact with the contact pad disposed thereunder.

10. The improvement recited in claim 7 wherein:
    said posts comprise a metal.

11. The improvement recited in claim 10 wherein:
    said posts are metallic.

12. The improvement recited in claim 7 wherein:
    said posts comprise a polymer.

13. The improvement recited in claim 12 wherein:
    said posts comprise at thermoplastic material.

14. The improvement recited in claim 12 wherein:
    said thermoplastic material is a polyetherimide.

15. The improvement recited in claim 12 wherein:
    said posts comprise a thermoset material.

16. The improvement recited in claim 15 wherein:
    said thermoset material is polyimide.

17. The improvement recited in claim 1 wherein:
    said first layer of polymer dielectric material is spaced from the surface of said electronic component by substantially the height of said spacer structure.

18. In a high density interconnect structure of the type comprising an electronic component having contact pads on a first surface thereof, an interconnection structure thereover including a first layer of polymer dielectric material disposed over said electronic component, said layer of polymer dielectric material having apertures therein disposed in alignment with at least first selected ones of said contact pads, a first patterned conductive layer overlying said first dielectric layer and extending into said apertures into ohmic contact with said selected ones of said contact pads, a second layer of polymer dielectric material disposed over said first layer of dielectric material, said second layer of polymer dielectric material having apertures therein disposed in alignment with second selected ones of said contact pads and/or selected portions of said first patterned conductive layer, a second patterned conductive layer overlying said second dielectric layer and extending into said apertures into ohmic contact with said second selected ones of said contact pads and/or selected portions of said first patterned conductive layer, the improvement comprising:

a spacer structure disposed on a portion of said first layer of dielectric material, leaving other portions of said first layer free of spacer structure; and said second layer of polymer dielectric material being bonded to said spacer structure and spaced from the surface of said first patterned conductive layer elsewhere by said spacer structure.

19. The improvement recited in claim 18 wherein said improvement further comprises:

a further spacer structure disposed on a portion of said first surface of said electronic component, leaving other portions of said first surface free of spacer structure; and wherein said first layer of polymer dielectric material is bonded to said spacer structure and spaced from said first surface of said electronic component elsewhere by substantially the height of said spacer structure.

20. In a high density interconnect structure of the type comprising an electronic component having contact pads thereon, one or more polymer dielectric material layers disposed thereover and having apertures therein, one or more patterned conductive layers overlying selected ones of said dielectric layers and extending into selected ones of said apertures into ohmic contact with selected contact pads or other conductive layers, the improvement comprising:

a plurality of posts disposed on said electronic component, each contact pad which is disposed in electrical contact with a conductor of said patterned conductive layers having a post disposed thereon and being referred to as a connected contact pad; and the one of said polymer dielectric material layers disposed nearest said electronic component being bonded to said posts and spaced from the surface of said electronic component elsewhere by substantially the height of said posts.

21. The improvement recited in claim 20 wherein: said posts comprise a polymer;

each of said posts which is disposed on one of said connected contact pads having a via hole therein through which a conductor of one of said conductor layers extends into electrical contact with the contact pad disposed thereunder.

22. The improvement recited in claim 20 wherein: said posts comprise a metal.

23. The improvement recited in claim 20 wherein: said posts comprise a polymer.

24. A semiconductor chip comprising:

a body of semiconductor material having a major surface;

a plurality of contact pads disposed on said major surface of said body;

a patterned spacer structure disposed on said major surface of said body and said at least selected ones of said contact pads, said spacer structure including a raised portion and a gap.

25. The semiconductor chip recited in claim 24 wherein:

said spacer structure is a polymer dielectric material.

26. The semiconductor chip recited in claim 24 wherein:

said spacer structure is conductive.

27. A semiconductor chip comprising:

a body of semiconductor material having a major surface;

a patterned spacer structure disposed on said major surface of said body and including a raised portion and a gap;

a plurality of contact pads disposed on said raised portion of said spacer structure whereby, said contact pads are spaced above said major surface of said body.

28. The semiconductor chip recited in claim 27 wherein:

said spacer structure is an inorganic dielectric material.

29. The semiconductor chip recited in claim 27 wherein:

said spacer structure is an polymer dielectric material.

* * * * *